(12) United States Patent
Tsai

(10) Patent No.: US 9,178,481 B2
(45) Date of Patent: Nov. 3, 2015

(54) VOLUME CONTROL METHOD AND SYSTEM

(71) Applicant: HON HAI PRECISION INDUSTRY CO., LTD., New Taipei (TW)

(72) Inventor: Hsiao-Jen Tsai, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 331 days.

(21) Appl. No.: 13/778,139

(22) Filed: Feb. 27, 2013

(65) Prior Publication Data

US 2014/0185831 A1 Jul. 3, 2014

(30) Foreign Application Priority Data

Dec. 28, 2012 (TW) .............................. 101150935 A

(51) Int. Cl.
*H03G 3/00* (2006.01)
*H03G 3/30* (2006.01)

(52) U.S. Cl.
CPC ........... *H03G 3/3089* (2013.01); *H03G 3/3005* (2013.01)

(58) Field of Classification Search
CPC ..... G10L 21/04; G10L 19/005; G10L 19/167; G10L 19/008; G10L 25/93; G10L 19/04; G10L 19/09; G10L 19/107; G10L 19/00; G10L 19/012; G10L 19/0212; G10L 2019/0001
See application file for complete search history.

(56) References Cited

U.S. PATENT DOCUMENTS 5,548,655 A * 8/1996 Takahashi ..................... 381/104
2006/0256776 A1 11/2006 Gladyshev et al.
2008/0059161 A1 * 3/2008 Khalil et al. .................. 704/226
2008/0269926 A1 10/2008 Xiang et al.
2009/0252347 A1 10/2009 Kakkeri et al.
2009/0316932 A1 12/2009 Campion
2010/0198377 A1 8/2010 Seefeldt et al.
2013/0185084 A1 * 7/2013 Rajendran et al. ............ 704/500

FOREIGN PATENT DOCUMENTS

| GB | 2420935 A | 6/2006 |
|----|-----------|--------|
| JP | 2007150877 A | 6/2007 |
| JP | 200811167 A | 1/2008 |
| TW | I354982 B1 | 12/2011 |
| TW | I365655 | 6/2012 |

* cited by examiner

*Primary Examiner* — Duc Nguyen
*Assistant Examiner* — Assad Mohammed
(74) *Attorney, Agent, or Firm* — Novak Druce Connolly Bove + Quigg LLP

(57) ABSTRACT

In a volume control method applied to an audio processing system, firstly, a digital audio stream including a plurality of digital audio packets is received from a transmitter. It is determined whether an excitation signal is detected. The digital audio packets are sampled within a predetermined sampled period according to codecing rules, on condition that the excitation signal is detected. Output values corresponding to the digital audio packets are retrieved from the sampled digital audio packets according to the sampling operation. The digital audio packets are analyzed to generate sums of sampled frequency. An averaged volume level is calculated according to the sums of sampled frequency. An audio shift value is generated according to the averaged volume level and a predetermined standard volume level. Volume control is implemented to subsequently received digital audio packets from the digital audio stream according to the audio shift value.

8 Claims, 5 Drawing Sheets

VOLUME CONTROL METHOD AND SYSTEM

BACKGROUND

1. Technical Field

The present disclosure relates to network communications, and more particularly to a volume control method and system typically applied to a Voice over Internet Protocol (VOIP) system.

2. Description of Related Art

FIG. 1 is a block diagram of a structure of a typical volume control system applied to an audio processing system, for example, a VOIP system. The volume control system comprises a transmitter (an outgoing side) 11 and a receiver (an incoming side) 13, each comprising a plurality of software and/or hardware modules or components.

The transmitter 11 at least comprises an analog-to-digital converter (ADC) 112, a codecing unit 114 and a packetizing module 116. The receiver 13 at least comprises a gain control unit 130, a digital-to-analog converter (DAC) 132, a codecing unit 134 and a de-packetizing module 136.

The ADC 112 retrieves an analog audio stream from an audio resource (not shown), and converts the analog audio stream to a digital audio stream. The codecing unit 114 samples the digital audio stream to generate a plurality of digital audio frames, and encodes (compresses) the sampled digital audio frames according to G.711 codecing rules. When the encoding process is complete, the codecing unit 114 outputs the encoded digital audio frames to the packetizing module 116.

The packetizing module 116 adds an Internet Protocol (IP) header to one of the encoded digital audio frames, and packetizes the encoded digital audio frame into a User Datagram Protocol (UDP) packet using a UDP module (not shown) of the volume control system. In addition, the packetizing module 116 packetizes the UDP packet into a Real-time Transport Protocol (RTP) packet using an RTP module (not shown) of the volume control system, and packetizes the RTP packet into an IP packet.

The above operations are repeated to packetize all of the encoded digital audio frames into IP packets. The packetizing module 116 may also packetize a number of the encoded digital audio frames into a single IP packet.

Each of the IP packets comprises a destination address and, consequently, can be transmitted to a correct destination via an IP network.

The IP packets forming the digital audio stream are transmitted from the transmitter 11 to the receiver 13. The de-packetizing module 136 retrieves and de-packetizes the IP packets into the RTP packets, de-packetizes the RTP packets into the UDP packets using the RTP module (not shown), and de-packetizes the UDP packets into the encoded digital audio frames using the UDP module (not shown).

The codecing unit 134 decodes the encoded digital audio frames to recover the digital audio stream with a pulse code modulation (PCM) format. The DAC 132 converts the digital audio stream to the analog audio stream (audio signals) for broadcast to a user located at the receiver 13. The volume of the audio signals may be controlled by the user with the gain control unit 130.

When a multiparty voice conference is held via a typical audio processing system, volume inconsistency usually occurs at separate incoming sides. Therefore users at each incoming side must manually achieve volume control, by gain control or by adjustment of parameters including linearity for power amplifier noise, for example. It is inconvenient for users to frequently use the volume control and, thus, an improved volume control method and system are desired.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

An exemplary embodiment of a volume control system of the present disclosure receives audio signals from an outgoing side, detects volume levels of the audio signals and, before the audio signals are transmitted to separate incoming sides for broadcast, implements volume control to the audio signals according to a preset or calculated volume level. Accordingly, the volume levels at separate incoming sides may be closer in value to each other. An exemplary embodiment of a volume control method carries out the above-described processes of the system.

Figure 2:
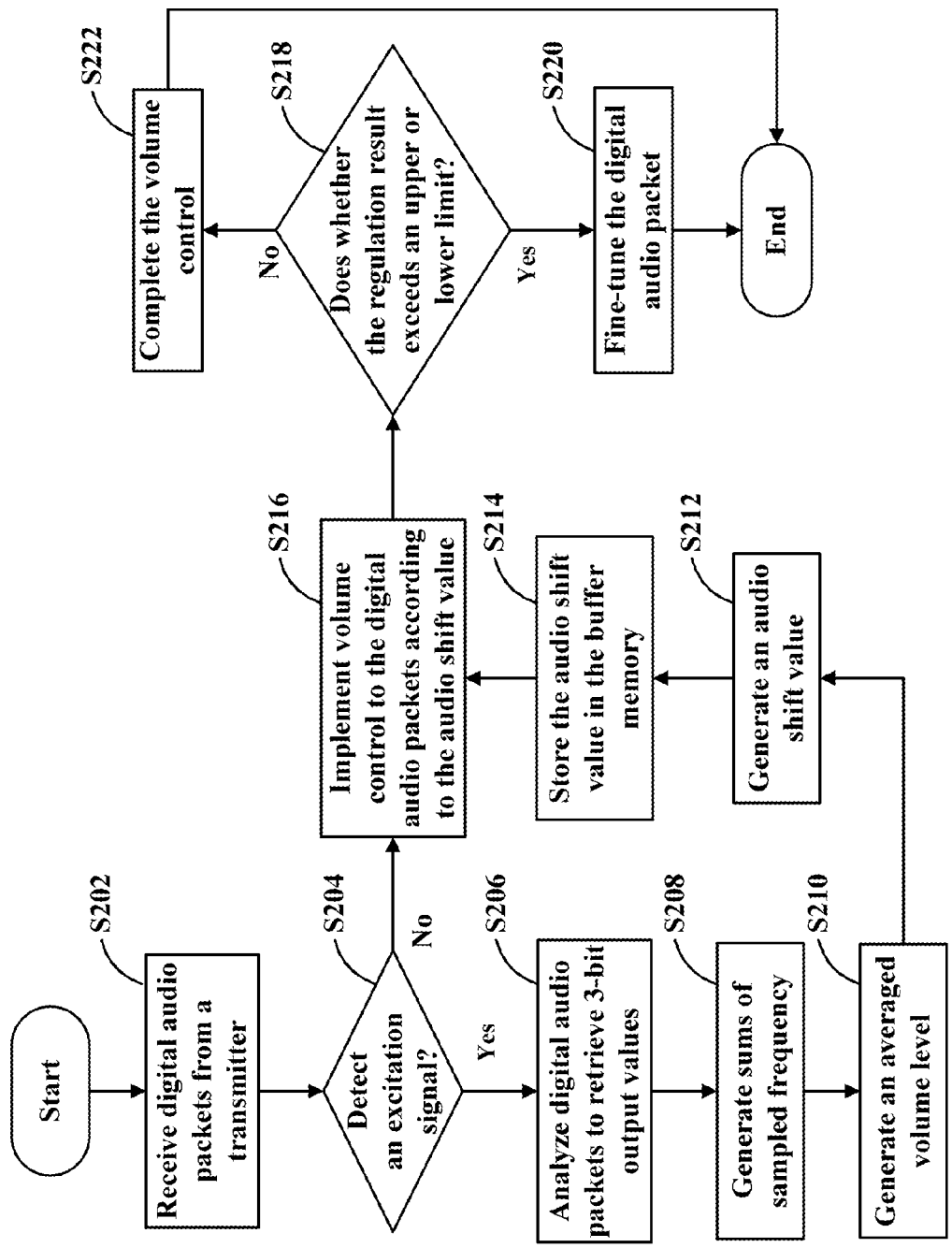
FIG. 2 is a flowchart of an exemplary embodiment of a volume control method in accordance with the present disclosure, the volume control method applied to a VOIP system.

FIG. 2 is a flowchart of an exemplary embodiment of a volume control method in accordance with the present disclosure. The volume control method is applied to an audio processing system, such as a VOIP system for example.

In step S202, the receiver (an incoming side) receives digital audio packets from a transmitter (an outgoing side).

In step S204, the receiver determines whether an excitation signal is detected. The timing of excitation is not fixed, but defined by the processing unit according to system design. Therefore, it only needs to sample excitation signals as detected at preset time intervals. In the hardware design, excitation signals can be transmitted to the processing unit via unused control pins or reserved control pins. The sample time intervals can be defined or controlled by firmware or software programs. If the determination is "yes," the procedure goes to step S206. If the determination is "no," the procedure goes directly to step S216 (see below).

In step S206, if the excitation signal is detected, digital audio packets within a time period are sampled. The time period, called a "sampled period" hereinafter, is about 8.192 seconds for example. Note that the length of the sampled period is dynamically defined according to practical applicable situations.

Based on the G.711 codecing rules, such as the u-Law algorithm for example, the digital audio packets are sampled to generate multiple 14-bit linear input codes, including s0000000wxyza, s0000001wxyza . . . and s1wxyzabcdefg.

The 14-bit linear input codes are converted to multiple 8-bit compressed codes. Relations between the 14-bit linear input codes and the 8-bit compressed codes are listed in a mapping table as shown in Table 1 stored in a buffer memory.

TABLE 1

| Linear Input Codes | Compressed Codes |
|---|---|
| s0000000wxyza . . . | s000wxvz |
| s0000001wxyza . . . | s001wxyz |
| s000001wxyzab . . . | s010wxyz |
| s00001wxyzabc . . . | s011wxyz |
| s0001wxyzabcd . . . | s100wxyz |
| s001wxyzabcde . . . | s101wxyz |
| s01wxyzabcdef . . . | s110wxyz |
| s1wxyzabcdefg . . . | s111wxyz |

The 8-bit compressed codes of the digital audio packets are analyzed to retrieve 3-bit output values, including 000, 001 . . . and 111, as shown in Table 1.

Note that, in step S206, generation operations for the 14-bit linear input codes and the 8-bit compressed codes are usually completed by the outgoing side.

In step S208, the digital audio packets within the sampled period are analyzed and calculated to generate sums of sampled frequency that correspond to different volume levels. As shown in Table 2 stored in the buffer memory, an exemplary embodiment of the present disclosure defines eight volume levels, including Level 0, Level 1 . . . and Level 7. During the sampled period, when one of the digital audio packets is sampled, it is determined that the sampled digital audio packet corresponds to a certain one of the Levels 0-7. If the sampled digital audio packet corresponds to Level 2, for example, a value of one is added to a sum of the sampled frequency of Level 2.

TABLE 2

| Volume Level | Sum | Output Value |
|---|---|---|
| Level 7 | 382 | 111 |
| Level 6 | 649 | 110 |
| Level 5 | 697 | 101 |
| Level 4 | 900 | 100 |
| Level 3 | 864 | 011 |
| Level 2 | 1204 | 010 |
| Level 1 | 1872 | 001 |
| Level 0 | 1432 | 000 |

In step S210, the sums of sampled frequency corresponding to the volume levels of the digital audio packets within the sampled period are obtained, such as 1432 (Level 0), 1872 (Level 1), . . . , and 382 (Level 7) as shown in Table 2. The sums of sampled frequency are calculated using a mathematical operation, such as a weighted averages method for example, to generate an averaged volume level.

In step S212, the averaged volume level is compared with a standard volume level stored in the buffer memory to generate an audio shift value. Note that the standard volume level may be user defined or systematically created.

In step S214, the audio shift value is stored in the buffer memory. Then the procedure goes to step S216.

In step S216, in this embodiment of the present disclosure, when the excitation signal is detected (in step S204), volume control is implemented to subsequently received digital audio packets according to the audio shift value calculated in step S210 until a new audio shift value is generated. When no excitation signal is detected (in step S204), volume control is implemented to subsequently received digital audio packets according to the previously calculated audio shift value. Note that, at the beginning of the process, volume control is executed according to a predetermined audio shift value for example. Alternatively, such volume control may be executed another way, or no such volume control may be executed.

Figure 3:
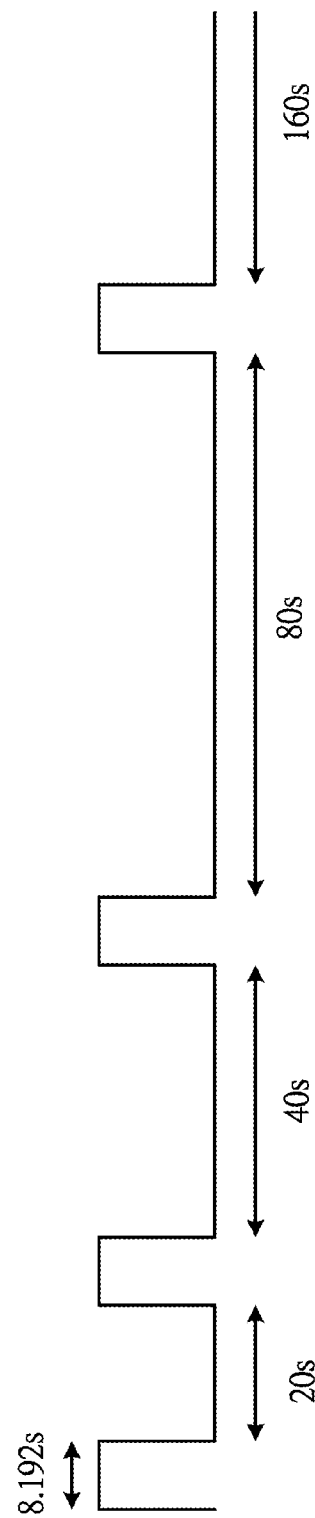
FIG. 3 is a schematic view of an exemplary embodiment of audio sampling by time intervals in multiples of twenty seconds in accordance with the present disclosure.

In the exemplary embodiment of the present disclosure, the audio sampling is carried out by, but is not limited to, time intervals in multiples of twenty seconds, as shown in FIG. 3. Note that the length of the time intervals may be changed according to practical applicable situations.

In step S218, when the volume control implemented to one of the digital audio packets is completed, it is determined whether the result of such regulation of the digital audio packet exceeds a predetermined upper limit or a predetermined lower limit. In practice, the volume of a digital audio packet may be raised but still result in a lower than desired level due to the limit of the 3-bit output value of the digital audio packet. Similarly, the volume of the digital audio packet may be lowered but still result in a higher than desired level due to the limit of the 3-bit output value of the digital audio packet.

In step S220, if the regulation result exceeds the upper limit or the lower limit, the digital audio packet is fine-tuned according to an upper bond value (i.e. limit) or a lower bond value (i.e. limit). Therefore, the volume level of the digital audio packet falls in the range between the maximum level (Level 7) and the minimum level (Level 0).

In step S222, if the regulation result does not exceed the upper limit or the lower limit, the volume control implemented in step S216 is implemented to the digital audio packet according to a previously calculated audio shift value such as the audio shift value calculated in step S210.

Figure 4:
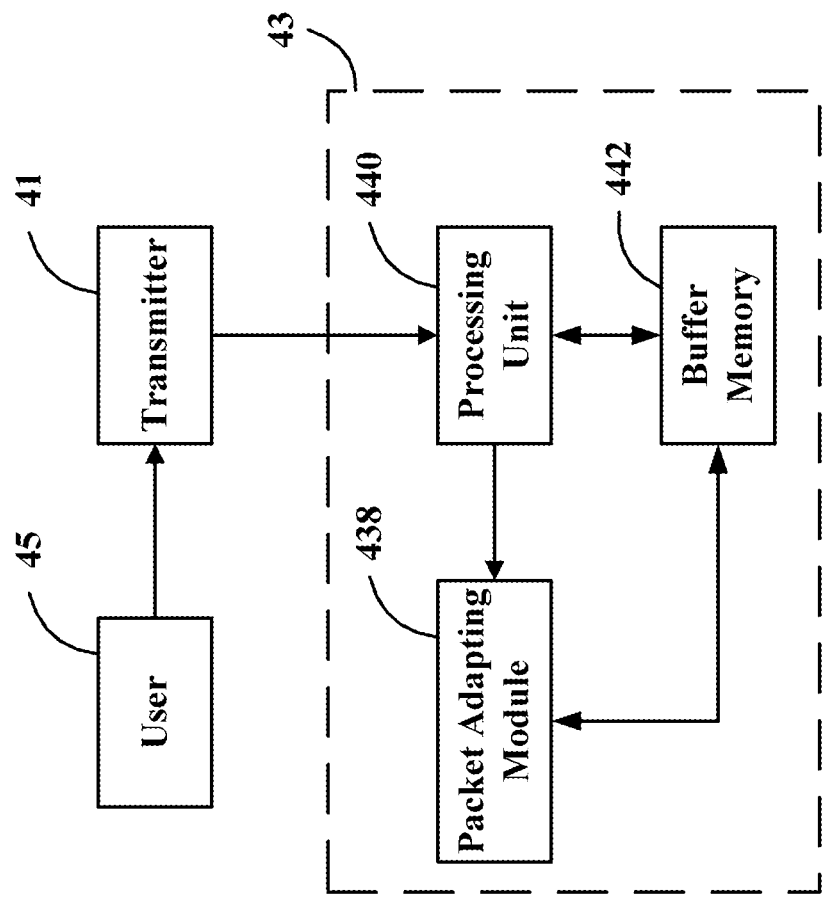
FIG. 4 is a block diagram of a first exemplary embodiment of a volume control system applied to a VOIP system in accordance with the present disclosure.

FIG. 4 is a diagram of a first exemplary embodiment of a volume control system applied to a VOIP system in accordance with the present disclosure.

The volume control system comprises a transmitter (an outgoing side) 41 and a receiver (an incoming side) 43, each composed of multiple hardware and/or software modules or components.

Figure 1:
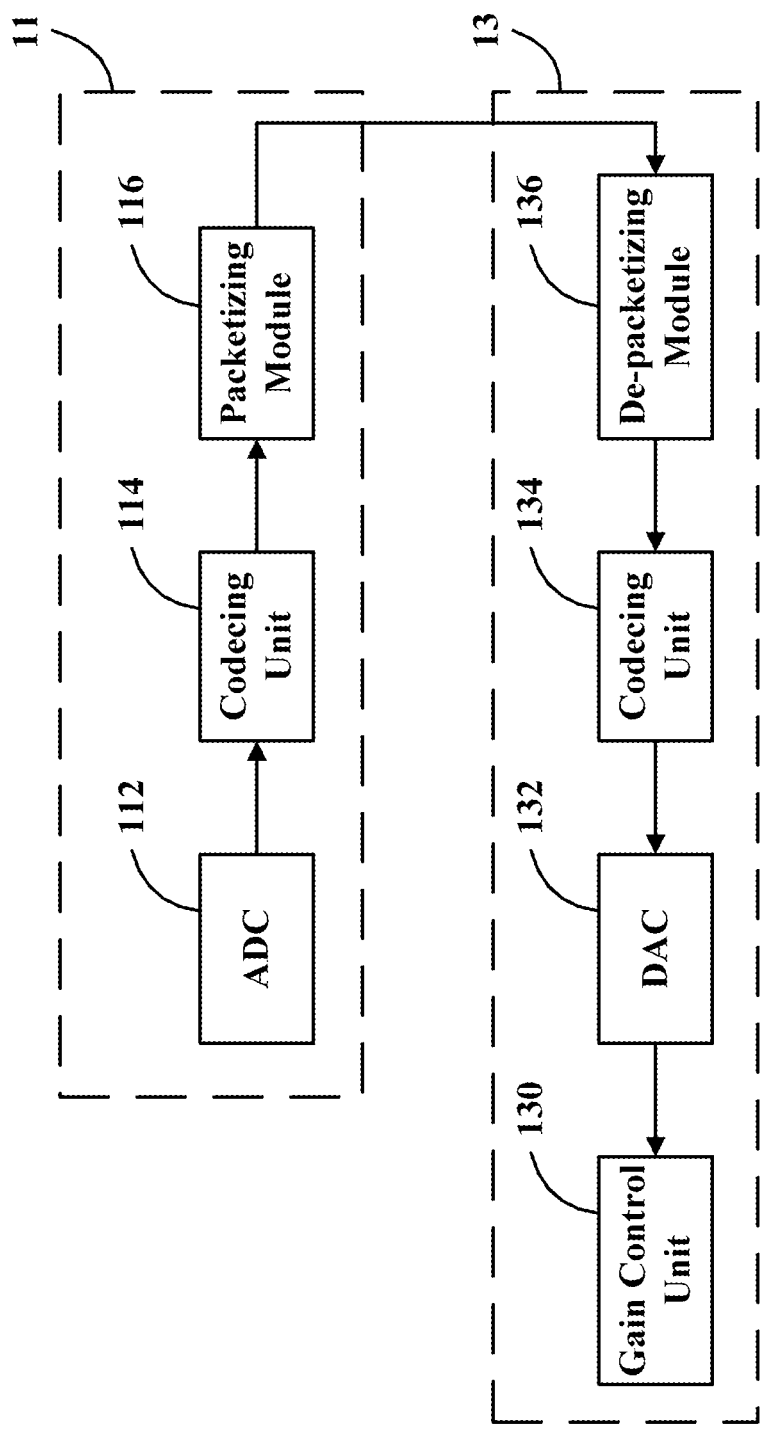
FIG. 1 is a block diagram of a typical volume control system applied to a VOIP system.

Modules included in the transmitter 41 act as, and execute similar operations to, the ADC 112, the codecing unit 114 and the packetizing unit 116 shown in FIG. 1. Accordingly, details of the modules of the transmitter 41 are not further described herein.

The receiver 43 at least comprises a packet adapting module 438, a processing unit 440 and a buffer memory 442.

Processing steps performed by the transmitter 41 include: retrieving audio signals (an analog audio stream) from a user 45, converting the analog audio stream to a digital audio stream, sampling the digital audio stream according to the G.711 codecing rules to generate the 14-bit linear input codes and the 8-bit compressed codes shown in Table 1, encoding and packetizing the digital audio stream into IP packets, and transmitting the IP packets to the receiver 43.

The processing unit 440 retrieves the IP packets, called digital audio packets hereinafter, and determines whether an excitation signal is detected. If the excitation signal is detected, the processing unit 440 samples and analyzes the digital audio packets within a sampled period according to, for example, the μ-Law algorithm of the G.711 codecing rules, to retrieve the 3-bit output values, including 000, 001 . . . and 111 as shown in Table 1.

The packet adapting module 438 analyzes and calculates the digital audio packets within the sampled period to generate sums of sampled frequency that correspond to different volume levels. As shown in Table 2 stored in the buffer memory 442, an embodiment of the present disclosure defines eight volume levels, including Level 0, Level 1 . . . and Level 7. During the sampled period, when one of the digital audio packets is sampled, the packet adapting module 438 determines that the sampled digital audio packet corresponds to a certain one of the Levels 0-7. If the sampled digital audio packet corresponds to Level 2, for example, a value of one is added to a sum of the sampled frequency corresponding to Level 2.

The packet adapting module 438 obtains and calculates the sums of sampled frequency corresponding to the volume levels of the digital audio packets within the sampled period, such as 1432 (Level 0), 1872 (Level 1), . . . , and 382 (Level 7). The sums of sampled frequency are calculated using a mathematical operation, such as a weighted averages method for example, to generate an averaged volume level.

The packet adapting module 438 compares the averaged volume level with a standard volume level stored in the buffer memory 442 to generate an audio shift value. Note that the standard volume level may be user defined or systematically created. When the volume control to one of the digital audio packets is completed, the packet adapting module 438 determines whether the result of such regulation of the digital audio packet exceeds a predetermined upper limit or a predetermined lower limit. If the regulation result exceeds the upper limit or the lower limit, the packet adapting module 438 fine-tunes the digital audio packet according to an upper bond value (i.e. limit) or a lower bond value (i.e. limit). If the regulation result does not exceed the upper limit or the lower limit, the packet adapting module 438 implements the volume control to the digital audio packet according to a previously calculated audio shift value.

Figure 5:
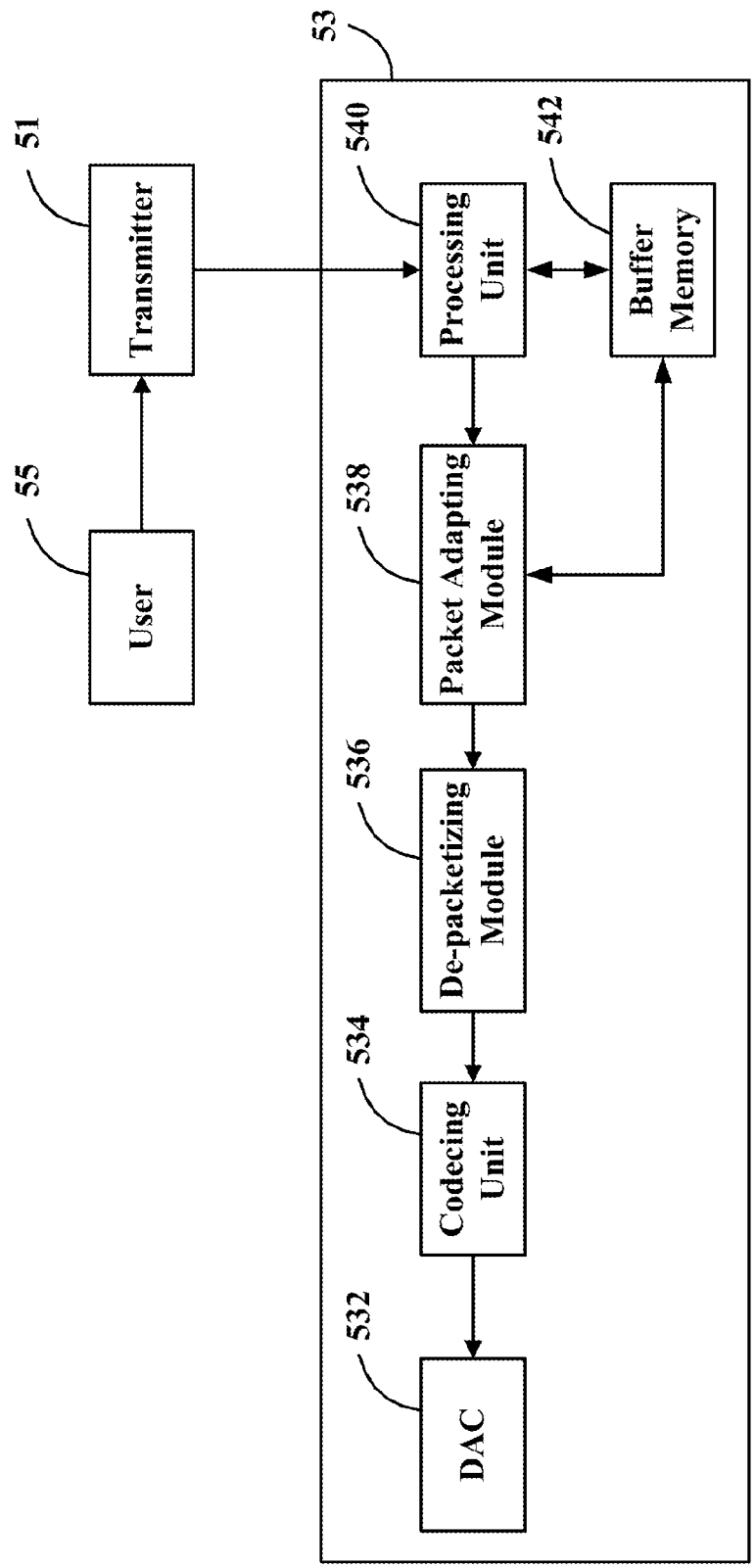
FIG. 5 is a block diagram of a second exemplary embodiment of a volume control system applied to a VOIP system in accordance with the present disclosure.

FIG. 5 is a diagram of a second exemplary embodiment of a volume control system applied to a VOIP system in accordance with the present disclosure.

The volume control system comprises a transmitter (an outgoing side) 51 and a receiver (an incoming side) 53, each composed of multiple hardware and/or software modules or components.

Modules included in the transmitter 51 act as, and execute similar operations to, the ADC 112, the codecing unit 114 and the packetizing unit 116 shown in FIG. 1. Accordingly, details of the modules of the transmitter 51 are not further described herein.

The receiver 53 at least comprises an ADC 532, a codecing unit 534, a de-packetizing module 536, a packet adapting module 538, a processing unit 540 and a buffer memory 542.

Processing steps performed by the transmitter 51 include: retrieving audio signals (an analog audio stream) from a user 55, converting the analog audio stream to a digital audio stream, sampling the digital audio stream according to the G.711 codecing rules to generate the 14-bit linear input codes and the 8-bit compressed codes shown in Table 1, encoding and packetizing the digital audio stream into IP packets, and transmitting the IP packets to the receiver 53.

The processing unit 540 retrieves the IP packets, called digital audio packets hereinafter, and determines whether an excitation signal is detected. If the excitation signal is detected, the processing unit 540 samples and analyzes digital audio packets within a sampled period according to, for example, the µ-Law algorithm of the G.711 codecing rules, to retrieve the 3-bit output values, including 000, 001, . . . , and 111, as shown in Table 1.

The packet adapting module 538 analyzes and calculates the digital audio packets within the sampled period to generate sums of sampled frequency that correspond to different volume levels. As shown in Table 2 stored in the buffer memory 542, an embodiment of the present disclosure defines eight volume levels, including Level 0, Level 1 . . . and Level 7. During the sampled period, when one of the digital audio packets is sampled, the packet adapting module 538 determines that the sampled digital audio packet corresponds to a certain one of the Levels 0-7. If the sampled digital audio packet corresponds to Level 2, for example, a value of one is added to a sum of the sampled frequency corresponding to Level 2.

The packet adapting module 538 obtains and calculates the sums of sampled frequency corresponding to the volume levels of the digital audio packets within the sampled period, such as 1432 (Level 0), 1872 (Level 1), . . . , and 382 (Level 7). The sums of sampled frequency are calculated using a mathematical operation, such as a weighted averages method for example, to generate an averaged volume level.

The packet adapting module 538 compares the averaged volume level with a standard volume level stored in the buffer memory 542 to generate an audio shift value. Note that the standard volume level may be user defined or systematically created. When the volume control to one of the digital audio packets is completed, the packet adapting module 538 determines whether the result of such regulation of the digital audio packet exceeds a predetermined upper limit or a predetermined lower limit. If the regulation result exceeds the upper limit or the lower limit, the packet adapting module 538 fine-tunes the digital audio packet according to an upper bond value (i.e. limit) or a lower bond value (i.e. limit). If the regulation result does not exceed the upper limit or the lower limit, the packet adapting module 538 implements the volume control to the digital audio packet according to a previously calculated audio shift value.

The de-packetizing module 536 retrieves the digital audio packets from the packet adapting module 538, de-packetizes the digital audio packets into RTP packets, de-packetizes the RTP packets into UDP packets using an RTP module (not shown), and de-packetizes the UDP packets into the encoded digital audio frames using a UDP module (not shown).

The codecing unit 534 decodes the encoded digital audio frames to recover the digital audio stream with a PCM format. The DAC 532 converts the digital audio stream to the analog audio stream (audio signals) for broadcast to a user located at the receiver 53. The volume of the audio signals may be controlled by the user using a gain control unit (not shown).

Note that exemplary embodiments of the volume control method and system of the present disclosure are implemented by software and/or hardware modules or components. The hardware modules used in the present disclosure can be implemented using multiple logic gates to execute the mathematical operations or processing steps mentioned above.

In exemplary embodiments of the volume control method and system of the present disclosure, volume control is implemented to audio signals before the audio signals are transmitted from an outgoing side to an incoming side, thereby mitigating or even eliminating volume inconsistency that would otherwise exist in a multiparty voice conference situation, for example.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A volume control method applied to an audio processing system, the method comprising:
   receiving a digital audio stream from a transmitter, the digital audio stream comprising a plurality of digital audio packets;
   determining whether an excitation signal is detected;
   sampling the digital audio packets within a sampled period according to codecing rules, on condition that the excitation signal is detected;
   retrieving output values corresponding to the digital audio packets from the sampled digital audio packets according to the sampling operation, wherein each of the output values corresponds to any one of a predetermined plurality of volume levels;
   analyzing the digital audio packets to generate sums of sampled frequency, wherein each of the sums of sampled frequency corresponds to one volume level of the plurality of volume levels;
   calculating an averaged volume level according to the sums of sampled frequency;
   generating an audio shift value according to the averaged volume level and a predetermined standard volume level; and
   implementing volume control to subsequently received digital audio packets from the digital audio stream according to the audio shift value.

2. The volume control method of claim 1, further comprising:
   determining whether a regulation result of a first one of the digital audio packets exceeds an upper limit or a lower limit; and
   fine-tuning the first digital audio packet according to an upper bond value or a lower bond value on condition that the regulation result exceeds the upper limit or the lower limit.

3. The volume control method of claim 2, further comprising:
   implementing the volume control to the first digital audio packet according to a previously calculated audio shift value on condition that the regulation result does not exceed the upper limit or the lower limit.

4. The volume control method of claim 1, further comprising:
   implementing the volume control to subsequently received digital audio packets from the digital audio stream according to the audio shift value until a new audio shift value is generated.

5. A volume control system applied to an audio processing system, the volume control system comprising:
   a transmitter, comprising a codecing unit for sampling a plurality of digital audio packets forming a digital audio stream; and
   a receiver, comprising:
      a processing unit for receiving the digital audio stream comprised of the digital audio packets from the transmitter, determining whether an excitation signal is detected, sampling the digital audio packets within a sampled period according to codecing rules on condition that the excitation signal is detected, and retrieving output values corresponding to the digital audio packets from the sampled digital audio packets according to the sampling operation, wherein each of the output values corresponds to any one of a predetermined plurality of volume levels; and
      a packet adapting module for analyzing the digital audio packets to generate sums of sampled frequency wherein each of the sums of sampled frequency corresponds to one volume level of the plurality of volume levels, calculating an averaged volume level according to the sums of sampled frequency, generating an audio shift value according to the averaged volume level and a predetermined standard volume level, and implementing volume control to subsequently received digital audio packets from the digital audio stream according to the audio shift value.

6. The volume control system of claim 5, wherein the packet adapting module determines whether a regulation result of a first one of the digital audio packets exceeds an upper limit or a lower limit and, on condition that the regulation result exceeds the upper limit or the lower limit, fine-tunes the first digital audio packet according to an upper bond value or a lower bond value.

7. The volume control system of claim 6, wherein, on condition that the regulation result does not exceed the upper limit or the lower limit, the packet adapting module implements the volume control to the first digital audio packet according to a previously calculated audio shift value.

8. The volume control system of claim 5, wherein the packet adapting module implements the volume control to subsequently received digital audio packets from the digital audio stream according to the audio shift value until a new audio shift value is generated.

* * * * *